United States Patent [19]
Blattner et al.

[11] Patent Number: 4,763,117
[45] Date of Patent: Aug. 9, 1988

[54] MEASUREMENT INSTRUMENTS WITH MULTIPLE OPERATION LEVELS

[75] Inventors: John D. Blattner, Beaverton; David B. Moser, Portland; Sam M. Deleganes, Aloha, all of Oreg.

[73] Assignee: Tektronix, Inc., Beaverton, Oreg.

[21] Appl. No.: 54,093

[22] Filed: May 26, 1987

Related U.S. Application Data

[63] Continuation of Ser. No. 893,442, Aug. 5, 1986, abandoned, which is a continuation of Ser. No. 478,605, Mar. 23, 1983, abandoned.

[51] Int. Cl.⁴ .............................................. H04Q 1/00
[52] U.S. Cl. .................................... 340/712; 364/481
[58] Field of Search ................. 324/114, 115, 73 AT; 371/15-29; 364/73 R, 200, 900; 340/365 S, 712

[56] References Cited

U.S. PATENT DOCUMENTS

| | | | |
|---|---|---|---|
| 3,324,458 | 6/1967 | MacArthur | 340/705 |
| 3,937,938 | 2/1976 | Matthews | 371/17 |
| 3,956,745 | 5/1976 | Ellis | 340/365 S |
| 4,001,807 | 1/1977 | Dallimonti | 340/525 |
| 4,101,883 | 7/1978 | Hempenius et al. | 340/286 M |
| 4,115,733 | 9/1978 | Silberberg | 324/115 X |
| 4,208,008 | 6/1980 | Smith | 371/15 |
| 4,425,643 | 1/1984 | Chapman et al. | 371/20 |
| 4,431,988 | 2/1984 | Molusis et al. | 340/712 |
| 4,434,488 | 2/1984 | Palmquist et al. | 371/15 |
| 4,480,317 | 10/1984 | Haag et al. | 364/900 |
| 4,481,587 | 11/1984 | Daniels, Jr. | 340/365 VL |
| 4,510,565 | 4/1985 | Dummermuth | 364/167 |
| 4,533,997 | 8/1985 | Furgenson | 364/200 |

Primary Examiner—Ulysses Weldon
Attorney, Agent, or Firm—John Smith-Hill; Francis I. Gray; Boulden G. Griffith

[57] ABSTRACT

A measurement instrument has a plurality of operation levels with different respective sets of operational functions associated therewith. Each operational function has at least two independently selectable characteristics related thereto. When an operation level of the instrument is selected, the instrument displays the characteristics related to each operational function associated with the selected operation level, and the operator is able to select one characteristic related to the or each operational function associated with the operation level. The characteristics related to at least one of the operational functions may each have a single value, e.g. relating to a mode of operation of the instrument. If one of the characteristics has a range of values, a value of that characteristic may be selected within the range.

6 Claims, 4 Drawing Sheets

MEASUREMENT INSTRUMENTS WITH MULTIPLE OPERATION LEVELS

This is a continuation of application Ser. No. 893,442 filed 8/5/86 and now abandoned which is a continuation of application Ser. No. 478,605 filed 3/23/83 and now abandoned.

This invention relates to measurement instruments with multiple operation levels.

BACKGROUND OF THE INVENTION

Various kinds of electronic measurement instruments have many functions as a result of the increasing operational complexity of such instruments. However, not all of the functions are needed for simple measurements, and the necessary functions are selected in accordance with level of measurement complexity, i.e., the operation level. The number of available functions is generally dependent on the operation level, i.e., more functions are available for a high operation level.

Conventional measurement instruments include many function keys or switches for making selections or setting values with respect to the functions, or they include numeric keys for making selections or setting values by reference to displayed menus. When operating the instruments, the operator is required to make selections or set values with respect to all the functions, even if he does not need some of the functions. He may select "don't care" with respect to an unnecessary function. These unnecessary setting operations are troublesome. Especially if the operator is not skilled, it is difficult for him to operate a measurement instrument having many functions.

SUMMARY OF THE INVENTION

According to the present invention there is provided a measurement instrument having a plurality of operation levels with different respective sets of operational functions associated therewith and each operational function having at least two independently selectable characteristics related thereto, said measurement instrument comprising means for selecting an operation level, means for displaying the characteristics related to each operational function associated with the selected operation level, and means for selecting one characteristic related to each operational function associated with the operation level.

In a preferred embodiment of the invention, the instrument first requests the operator to select an operation level. The instrument displays menus of only the necessary functions in accordance with the selected operation level. If a low operation level is selected, the number of functions may be small, and if the operation level is high, the number of functions is large. Thus, the operator is only required to make selections or set values with respect to the necessary functions, and unnecessary functions are set to appropriate default values.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
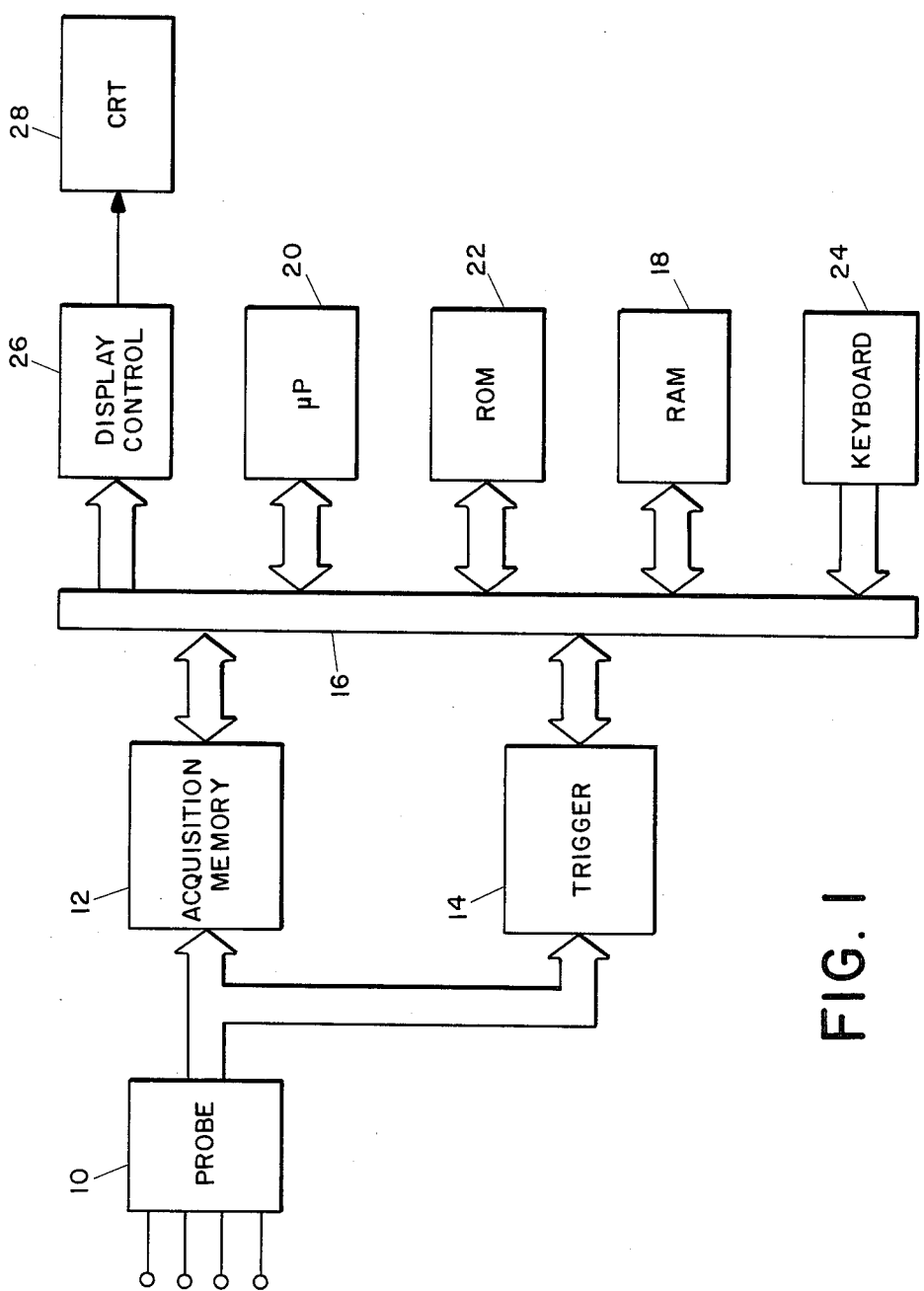
FIG. 1 is a block diagram of a logic analyzer embodying the present invention.

A preferred embodiment of the present invention used in a logic analyzer will be discussed. FIG. 1 shows a block diagram of a logic analyzer employing the present invention. A probe pod 10 having four tips acquires logic signals and transfers them to an acquisition memory circuit 12 and a trigger circuit 14. The memory circuit 12 includes a high speed memory for storing the input logic signals, and two timebases for controlling the acquisition rate of the high speed memory. The trigger circuit 14 includes a word recognizer (detecting a predetermined word from the input word consisting of the input logic signals) with a filter function, and a counter for a digital delay. The parameters of these functions in circuits 12 and 14 are set from instruction data from a bus 16 consisting of data, address and control lines. When the trigger circuit 14 generates a trigger (stop) signal, the acquisition memory circuit 12 stops acquiring the input logic signals and the stored signals are transferred to a random access memory (RAM) 18 via the bus 16.

The bus 16 is further connected to a microprocessor 20 such as an 8088 or Z-80, a read-only memory (ROM) 22 for storing the processing sequence of the microprocessor 20, a keyboard 24 as an input device, and a display control circuit 26 for causing measurement results and function menus to be displayed on a display device 28 such as a cathode ray tube (CRT). The microprocessor 20 controls the operation of the logic analyzer, including the parameter setting, by using the RAM 18 as a temporary memory under the control of the ROM 22.

Figure 2:
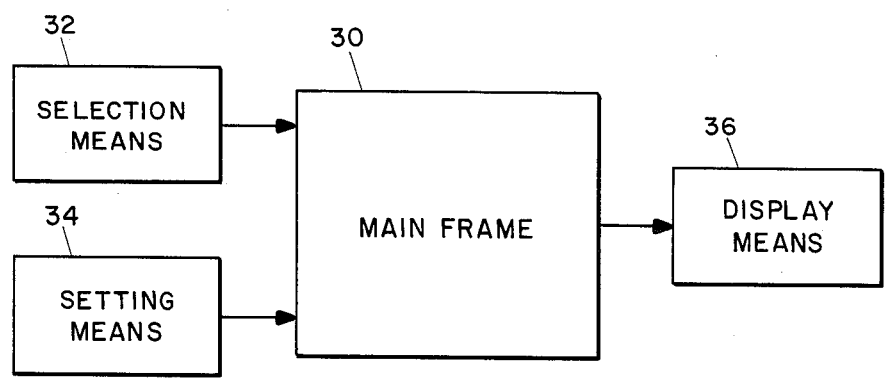
FIG. 2 is a functional diagram of the logic analyzer.

FIG. 2 shows a function diagram for the parameter setting operation in FIG. 1. The main frame 30 shown in FIG. 2 corresponds to the microprocessor 20, ROM 22 and RAM 18 which control the setting of the parameters of the measurement instrument. Both the selection means 32 and the setting means 34 correspond to the keyboard 24, which is used both for selecting the operation level and, when the level has been selected, setting the parameters. The display means 36 corresponds to the combination of the display control circuit 26 and CRT 28, and displays the menu in accordance with the output from the main frame 30.

Figure 4:
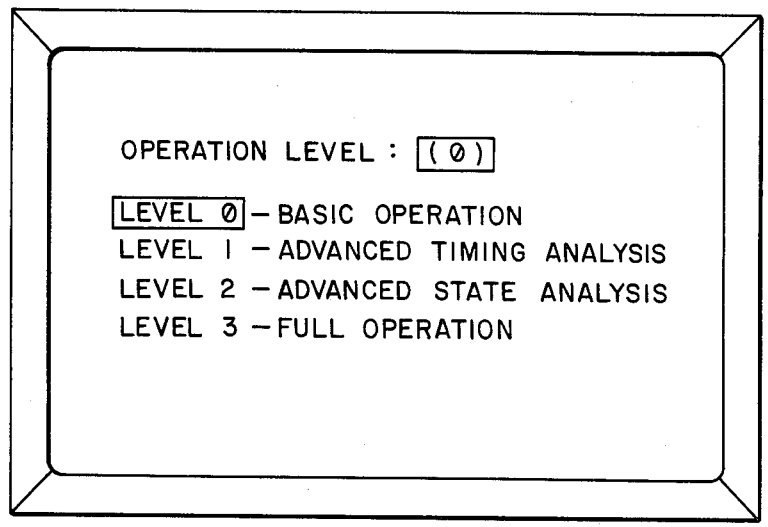
FIG. 4 is an example of a display that might be provided by the logic analyzer.
Figure 3:
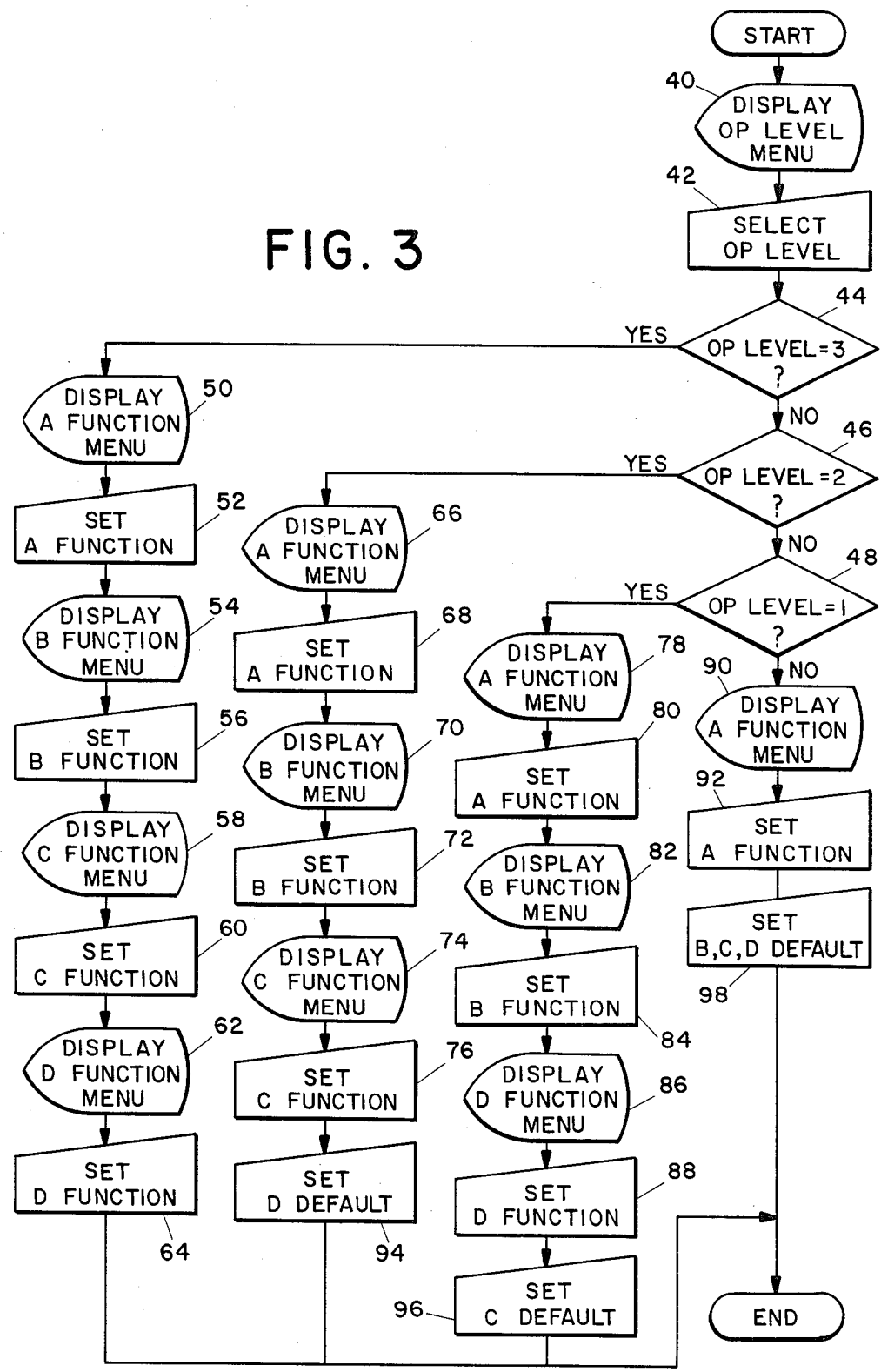
FIG. 3 is a flow chart illustrating operation of the FIG. 1 logic analyzer.

The operation of the instrument will be described with reference to the flow chart illustrated in FIG. 3. Initially, in step 40, the main frame 30 displays a menu of the operation levels on the display means. In the illustrated instrument, four operation levels are available, and an example of the display that might be provided is shown in FIG. 4. Level 0 is basic operation, i.e., basic timing and state analysis, level 1 is advanced timing analysis (with basic state operation), level 2 is advanced state analysis (with basic timing operation), and level 3 is full operation, i.e. advanced timing and state analysis. The instrument has four operational functions, called functions A, B, C and D for convenience. Function A is the timebase 1, function B is the trigger search starting point, function C is the timebase 2 and function D is the filter on the word recognizer. The relation among the operation levels and the functions is shown in the following table.

| function | operation level | | | |
|---|---|---|---|---|
| | 0 | 1 | 2 | 3 |
| A | O | O | O | O |
| B | X | O | O | O |
| C | X | X | O | O |
| D | X | O | X | O |

In the table, "O" and "X" means "available" and "not available (set to default)", respectively. As can be understood from the table, in basic operation (level 0) only the timebase 1 (function A) is available and consequently it is only necessary for the operator to make selections relating to the timebase 1. The selections relating to functions B, C and D are automatically set by the instrument to appropriate default settings. Similarly, in operation level 1 the functions A, B and D are available and the operator must make selections relating to these functions. In operation level 2 the operator must make the selections relating to the functions A, B and C, and in operation level 3 the operator must make selections relating to all four functions A, B, C and D. As in the case of level 0, in levels, 1 and 2 the selections corresponding to the functions that are not available to the operator are automatically set to default settings.

Each operational function has two or more selections associated therewith. For example, when function A is available (as it is for each operation level), the operator must first select whether the timebase 1 is to be controlled synchronously with the circuit under test or is to be controlled asynchronously. If the timebase 1 is to be controlled synchronously, the operator must then select which clock pulse from the circuit under test is to be used for controlling the timebase, and what clock qualifiers are to be used, e.g. whether the instrument should respond only to clock pulses when valid data is present. If the timebase 1 is to be controlled asynchronously, the operator must select the sample interval, e.g. in the range from 10 ns to 1 s in a 1, 2, 5 sequence, and must also select the clock qualifiers. When function B is selected (operation levels 1, 2 and 3), the operator must select whether the instrument should search for a trigger pulse immediately after it begins to receive data, or wait until the acquisition memory is full.

Returning now to FIG. 3, in step 42 the operator can select one of the operation levels by using the selection means 32. The level 0 is selected in the case of FIG. 4, wherein the selected level is highlighted (shown within a rectangular frame). The main frame 30 examines the selected operation level against the possible operation levels in steps 44, 46 and 48. If the highest level, level 3, is selected, the menu of the function A is displayed on the display means 36 in step 50. This display is similar to FIG. 4. In step 52, the operator uses the setting means 34 to make selections from the menu for the function A, i.e. synchronous or asynchronous, if synchronous, which clock and what clock qualifiers, and, if asynchronous, the time base and the clock qualifiers. Similarly to steps 50 and 52, the selections relating to functions B, C and D are made in steps 54 through 64. If the operation level 2 is selected, the selections relating to functions A, B and C are made in steps 66 through 76. Function D is placed in a default setting specific to level 2 in step 94. If the operation level 1 is selected, the selections relating to functions A, B and D are made in steps 78 through 88, and function C is placed in a default setting specific to level 1 in step 96. If the lowest operation level (level 0) is selected, the selections relating to function A are made in steps 90 and 92, and functions B, C and D are placed in default settings specific to level 0 in step 98. It should be noted that the operation levels 2 and 1 do not require the operator to make selections relating to functions D and C respectively. Operation level 0 requires the operator to make selections relating to the function A. In each case where a function is placed in a default setting, the menu for that function does not appear on the display. Thus, it is easy to make the necessary selections, and the possibility of making an improper selection for an unavailable function is avoided.

Figure 5:
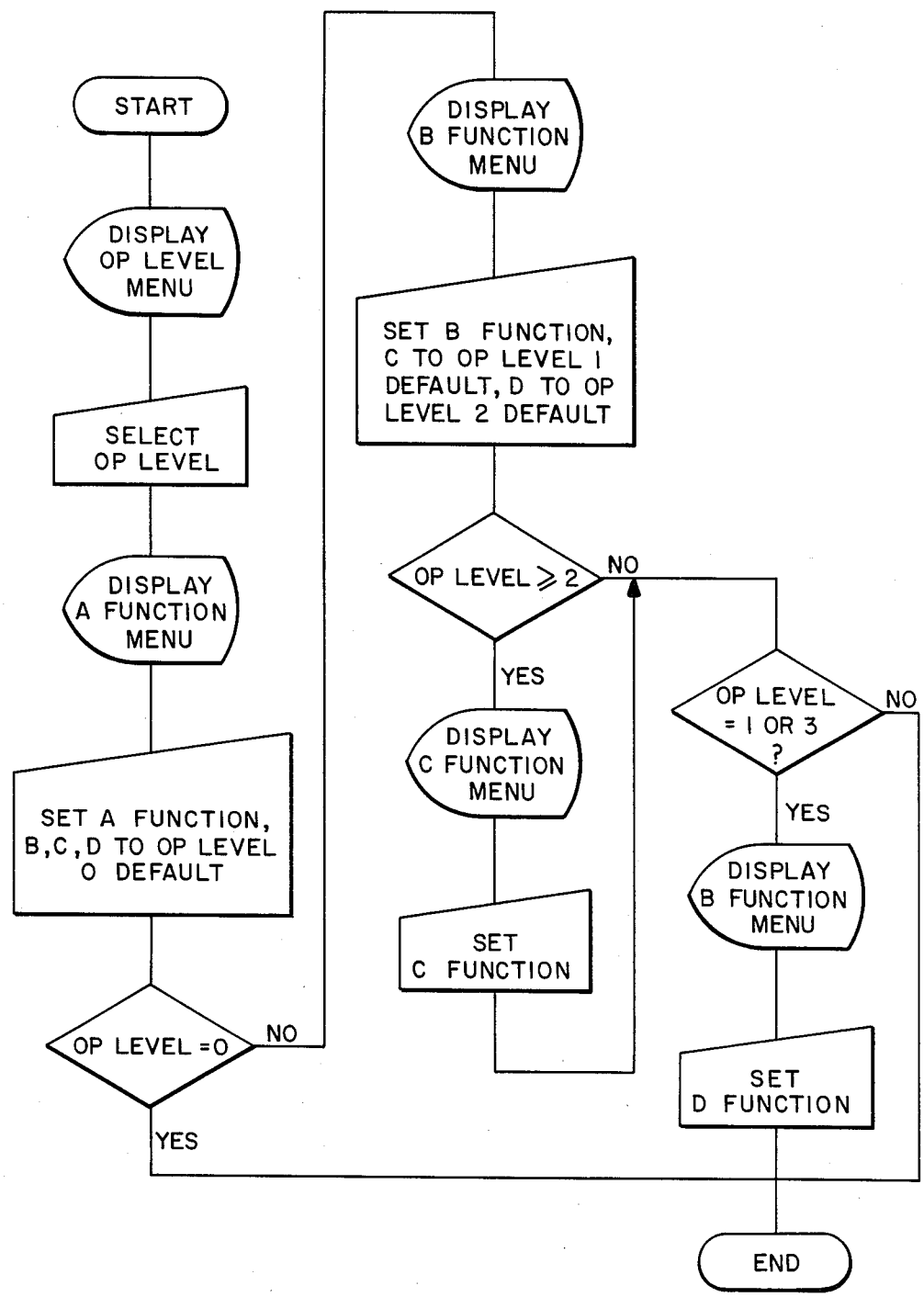
FIG. 5 is a second flow chart illustrating an alternative mode of operation of a logic analyzer embodying the present invention.

FIG. 5 shows a flow chart for an alternative processing sequence. This flow chart reduces the number of the operating steps in comparison with the flow chart of FIG. 3. Since the operation according to this flow chart can be understood easily from FIG. 5, no description will be made.

As can be understood from the foregoing description, the main frame 30 requests the operator to make only the selections that are required in order to implement the functions associated with the selected operation level, so that it is easy to set the measurement instrument. Even if the measurement instrument has many complex functions, it can be operated by an operator without its being necessary for the operator to have a detailed understanding of, or extensive training in, operation of the instrument.

It will be appreciated that the invention is not restricted to the particular instrument that has been described and illustrated, since variations may be made therein without departing from the scope of the invention as defined in the appended claims, and equivalents thereof. For example, the selection and setting means may be any switch such as a rotary switch, a toggle switch, etc., and the display means may be a flat display panel. The present invention can be applied to many measurement instruments including the logic analyzer.

I claim:

1. A measurement instrument for processing an input signal comprising:
    means for selecting one of a plurality of available operation levels for the measurement instrument, each of said available operation levels having a plurality of operational functions and each of said operational functions having at least two independently selectable characteristics, wherein the plurality of available operation levels include a higher level and a lower level, the set of operational functions associated with the lower level being a sub-set of the set of operational functions associated with the higher level;
    means for displaying the characteristics related to each operational function associated with the selected operation level;
    means for selecting from the displayed characteristics one characteristic related to each operational function associated with the selected operation level, the selected characteristics defining a plurality of parameters for processing the input signal; and
    means operative when the lower level is selected for automatically placing operational functions associated with the higher level, but not with the lower level, in a default setting.

2. An instrument according to claim 1, wherein the characteristics related to at least one of the operational functions each have a single value.

3. An instrument according to claim 1, wherein at least one of the characteristics related to one of the operational functions has a range of values, and the instrument comprises means for selecting a value of said one characteristic within said range.

4. A measurement instrument having:
input means for receiving at least one information-bearing input signal;
processing means for processing the information borne by said information-bearing signal according to a plurality of selectable parameters;
output means for making the result of the processing means available externally of the processing means; and
user interface means for allowing a user of the instrument to select one of a plurality of available operation levels for the instrument, each operation level having a plurality of operational functions and each operational function having at least two independently selectable characteristics, for displaying to the user the characteristics related to each operational function associated with the selected operation level, and for allowing the user to select from the displayed characteristics one characteristic related to each operational function associated with the selected operation level, thereby defining the selectable parameters for the processing means, wherein the plurality of available operation levels include a higher level, an intermediate level and a lower level, the number of operational functions associated with the intermediate level being greater than the number of operational functions associated with the lower level and being less than the number of operational functions associated with the higher level, and wherein the processing means are operative when the lower level is selected to place functions associated with the intermediate or upper level, but not with the lower level, in a default setting, and when the intermediate level is selected to place operational functions associated with the upper level, but not the intermediate level, in a default setting.

5. An instrument according to claim 4, wherein the input means comprise probe means for connection to an electronic device under test for delivering said information-bearing signal to the processing means.

6. A method for processing an input signal comprising the steps of:
selecting one of a plurality of available operation levels for processing the input signal, each of said available operation levels having a plurality of operational functions and each of said operational functions having at least two independently selectable characteristics;
displaying the characteristics related to each operational function associated with the selected operation level;
selecting from the displayed characteristics one characteristic related to each operational function associated with the selected operation level, the selected characteristics defining a plurality of parameters for processing the input signal; and
automatically selecting the characteristics for operational functions not displayed for the selected operation level, the displaying step displaying the characteristics related to a sub-set of the operational functions associated with the selected operation level.

* * * * *